United States Patent [19]

Agraz-Guerena et al.

[11] 4,278,705
[45] Jul. 14, 1981

[54] SEQUENTIALLY ANNEALED OXIDATION OF SILICON TO FILL TRENCHES WITH SILICON DIOXIDE

[75] Inventors: Jorge Agraz-Guerena, Hanover Township, Northampton County; Lewis E. Katz; Bernard L. Morris, both of Allentown, all of Pa.

[73] Assignee: Bell Telephone Laboratories, Incorporated, Murray Hill, N.J.

[21] Appl. No.: 92,523

[22] Filed: Nov. 8, 1979

[51] Int. Cl.³ .................. H01L 21/316; H01L 21/324
[52] U.S. Cl. ........................................ 427/93; 357/49; 357/55; 427/96; 427/255; 427/255.3; 427/255.4; 427/379
[58] Field of Search .................. 427/379, 93, 96, 255, 427/255.3, 255.4

[56] References Cited

U.S. PATENT DOCUMENTS

| 3,913,211 | 10/1975 | Seeds et al. | 427/93 |
| 3,958,040 | 5/1976 | Webb | 427/93 |
| 3,969,162 | 7/1976 | Kuhn | 427/85 |
| 4,001,465 | 1/1977 | Graul et al. | 427/93 |
| 4,042,726 | 8/1977 | Kaji et al. | 427/93 |
| 4,079,506 | 3/1978 | Suzuki et al. | 427/93 |
| 4,139,658 | 2/1979 | Cohen et al. | 427/93 |
| 4,140,548 | 2/1979 | Zimmer | 427/93 |
| 4,167,915 | 9/1979 | Toole et al. | 427/93 |
| 4,199,384 | 4/1980 | Hsu | 427/93 |

OTHER PUBLICATIONS

Capell et al. "Process Refinements bring C-MOS on Sapphire into Commercial Use", Electronics, May 26, 1977, pp. 99–105.

Primary Examiner—John D. Smith
Attorney, Agent, or Firm—Arthur J. Torsiglieri

[57] ABSTRACT

A process for making dielectrically isolated silicon integrated circuits which use silicon oxide filled trenches to provide isolation is described. To minimize damage to the silicon, the trenches are filled by sequentially annealed oxidation process which involves alternately growing some oxide and then annealing to relieve stresses before growing more oxide.

5 Claims, 2 Drawing Figures

SEQUENTIALLY ANNEALED OXIDATION OF SILICON TO FILL TRENCHES WITH SILICON DIOXIDE

BACKGROUND OF THE INVENTION

1. Field of the Invention

This invention relates to the fabrication of silicon integrated circuits that use silicon oxide to provide dielectric isolation between components.

2. Description of the Prior Art

It is well known to use silicon oxide to provide dielectric isolation in silicon integrated circuits. In such a process a trench is often formed by selective etching in the silicon chip and this trench is later filled by thermal oxidation selectivity of the trenched portion. Use is often made of the fact that thermally grown silicon oxide has approximately twice the volume of the silicon consumed to fill the trench so that a substantially planar final surface can be achieved. Such a planar surface is desirable to facilitate the interconnection of components of the integrated circuit by overlay metallizations.

In a process of this kind, because the thermally grown oxide grows both from the bottom and the vertical walls of the trench, stresses tend to develop in the thermally grown trench filler, particularly if the trench is not completely smooth, as is usually the case, and if the material in which the trench is formed involves epitaxially grown material. Such stresses have undesirable effects, such as inducing damage in the surrounding silicon, militating against a high packing density of components in the chip. This problem seems to be particularly acute when the thermal oxidation is done at relatively low temperature (e.g., 760–900 degrees C.) as is sometimes desirable for other reasons, because the viscosity of the growing oxide is considerably higher at such temperatures and stress-induced damage in the silicon is more likely to occur.

SUMMARY OF THE INVENTION

An object of the invention is to fill trenches in a silicon chip with thermally grown oxide with little damage to the surrounding chip.

To this end, the invention involves the use of a process to be called sequentially annealed oxidation (SAO). This process involves growing a desired thickness of oxide in a trench in a sequence of alternating growing and annealing steps. Each growing step increases the thickness of the oxide but stops short of an increment sufficient to produce a stress large enough to induce any permanent damage in the surrounding silicon. Each annealing step is designed to permit the grown oxide to flow and relieve any accumulated stress. Each growing step involves heating the silicon in a relatively strong oxidizing atmosphere, primarily conductive to oxide growth whereas the annealing step involves heating the silicon under conditions that result primarily in relieving the stresses rather than oxide growth.

In a preferred embodiment the first growing step is at high temperature while the subsequent growing steps are at a lower temperature. Additionally, the first growing step is in steam at atmospheric pressure whereas the subsequent growing steps are essentially in steam at high pressure. Moreover, the first layer grown is thicker than the second layer but each successive layer thereafter is thicker than the previous layer.

BRIEF DESCRIPTION OF THE DRAWING

In the drawing, (which is not to scale)

DETAILED DESCRIPTION

Figure 1:
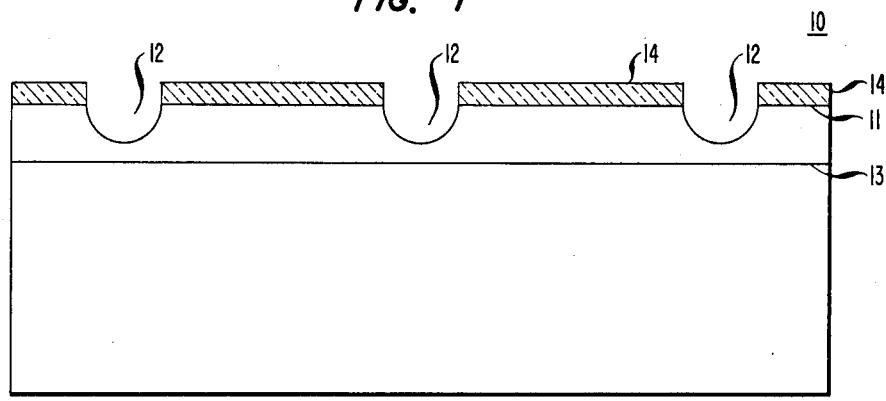
FIG. 1 shows a silicon chip which has been provided with trenches to be filled with silicon oxide.

FIG. 1 shows a silicon chip 10 having a major surface 11 whose planarity is interrupted by a series of trenches 12 that are used to separate the chip into a number of discrete sections. Each trench typically penetrates the chip sufficiently to approach or penetrate beyond a junction 13, parallel with the surface 11, between regions of different electrical characteristics, either resistivities and/or resistivity-types. Such a junction tends to cooperate with the trenches to provide electrical isolation between the discrete sections. Typically the silicon forming this major surface portion will have been formed by a vapor-phase epitaxial growth process. The completed chip normally will include additional junctions within each discrete section to define the electrical properties of each section and these junctions may be introduced at various points in the complete process either before or after the formation of the trenches or the filling of the trenches.

Moreover, the surface 11 normally will include a coating 14, overlying the silicon chip except in the region of the trenches, which was used as a mask in defining the pattern of the trenches during their formation, and which can be used to protect the underlying portion of the silicon chip during the oxidation of the exposed silicon in the trenches.

The coating 14 may be a composite of two separate layers, such as a silicon oxide layer proximate the surface of the silicon chip and a superposed silicon nitride layer. In any case, the coating should be a barrier to oxidation of the underlying silicon and so normally should be little affected by the processing used to fill the trenches with silicon oxide.

It can be appreciated that a variety of techniques are available for achieving a structure of this kind. One such technique is described in a copending application Ser. No. 965,992, filed Dec. 4, 1978, and having a common assignee with this application (J. Agraz-Guerena-P. T. Panousis-R.L. Pritchett Case 4-8-7). In the process described therein, the trenches are formed by a gas plasma etching process, and the depth of the trench is such that it does not penetrate the junction 13 but it is close enough that the subsequent oxidation of the exposed silicon will move the silicon oxide-silicon interface below the junction 13. Additionally in that process, before filling the trench, to prevent lifting or separation of the silicon nitride mask layer during the subsequent thermal oxidation, it is sometimes useful to deposit a layer of silicon oxide over the entire surface of the chip. Typically, the nitride and the overlying oxide may each be about 1000 Angstroms thick. This oxide deposition step has been found to make useful thinner silicon nitride layers than otherwise.

Typically the dimensions of the trench include a width of several microns, comparable to the width of the line features of the circuit, and a depth of about a micron, comparable to the depth of epitaxial layers now used in high density bipolar integrated circuits.

Figure 2:
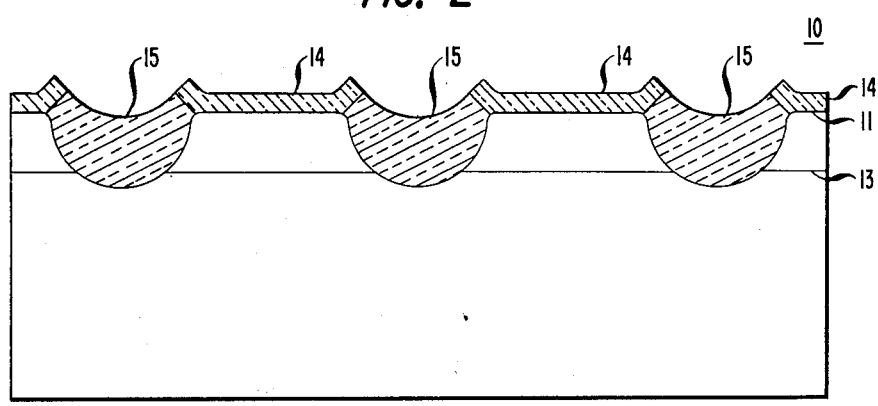
FIG. 2 shows the same chip after the trenches have been filled in accordance with the invention.

FIG. 2 shows the silicon chip 10 after the trenches 12 have been filled with silicon dioxide 20 in accordance with the practice of the invention. As is seen, the trenches are filled in a fashion to reestablish substantial planarity to surface 13 over which is to be disposed subsequently a pattern of conductors (not shown) for interconnecting the various components in each discrete section in accordance with a desired circuit function. The silicon oxide does exhibit the familiar bird's beak pattern as shown. Also, the silicon-silicon oxide interface has penetrated below junction 13.

In accordance with the invention, the trenches 12 are filled by sequentially annealed oxidation. In one illustrative embodiment used to fill trenches having a width of about 5 microns and a depth of 0.9 micron (9000 Angstroms) the following series of steps were used.

The first growing step to form an oxide layer 3000 Angstroms thick involved heating for an hour at about 950 degrees C. in atmospheric steam. This is a strongly oxidizing atmosphere. The first annealing step involved heating also to about 950 degrees C for about 10 minutes in an ambient of about 99% oxygen and 1% hydrochloric acid at atmospheric pressure. The presence of the HCl seems to improve the viscosity of the silicon oxide although it may be unnecessary. At this temperature this ambient is only weakly oxidizing and results in inappreciable further oxidation of the already oxidized exposed surface of the trenches. As a consequence, this step primarily serves only to relax the stresses in the oxide in the trenches and the surrounding silicon.

This was followed by a series of alternating heating and annealing steps. Each of these growing steps involved heating at 760 degrees C. in steam at a pressure of about 20 atmospheres. These constitute highly oxidizing conditions. Each of the annealing steps used the same conditions as the first annealing step. The successive growing steps were used to grow successive layers of about 1200 Angstroms, 1600 Angstroms, 1800 Angstroms, 2900 Angstroms, 3500 Angstroms and 4400 Angstroms, for a total thickness of about 18,000 Angstroms needed to fill the 0.9 micron trench. The times for these heating steps were 15 minutes, 28 minutes, 34 minutes, 60 minutes, 78 minutes and 113 minutes, respectively.

After the trenches are filled, the chip is processed in the usual fashion.

It will, of course, be appreciated that various modifications should be feasible consistent with the broader principles of the invention.

First, it is expected that subsequent development will permit a decrease in the number of cycles that will be needed. In particular, the number of cycles best used for a particular chip will be dependent on a variety of considerations, including the dimensions of the trenches and an economic balance between expense and quality. For example, we have had satisfactory results in some instances with only four cycles.

In particular, the smoother the trenches initially, the thicker and fewer the layers that may be used.

Generally it is desirable to start with a thick initial layer. This factor usually makes advantageous growing the first layer at a relatively high temperature, e.g., 950 degrees C., although there is usually a limit on how long the chip may be exposed to such temperatures without deleterious effects. This tends to limit the maximum thickness of the first layer that can be grown without detracting from quality. Use of a higher pressure may be used to increase the thickness that may be grown at a given temperature in a given time. Special furnaces may prove useful to do the heating at high temperatures and high pressures.

In annealing the higher the temperature used the shorter the time. One other possibility is the use of laser annealing in which case the annealing time might be very short. In practice we have found it feasible to anneal at temperatures as low as 760 degrees C. with longer times when it is desirable to minimize the time at which the chip is kept at high temperatures.

In both growing and annealing, wide variation should be feasible in temperature, ambient, and pressure conditions.

In the embodiment described it was found advantageous to grow a relatively thick first layer and a relatively thin second layer with subsequent layers increasing in thickness. Other growth patterns may also be practiced.

In an automated process, it may be feasible to pass a chip through a succession of furnaces, the conditions of each of which can be optimized separately. In other instances, in which fewer furnaces are available, it may prove economic to do as much of the heating as possible at one given temperature.

Also in some instances, it will be feasible to avoid as a separate step the last annealing step, relying instead for this on heating done in the subsequent processing of the chip.

We claim:

1. In the fabrication of silicon integrated circuits made in silicon chips which utilize trenches filled with silicon oxide to provide dielectric isolation between different surface portions of the chip, the process of filling the trenches in the silicon chip with silicon oxide which comprises heating the silicon chip, which has been masked to leave exposed the trenches while covering the surface between the trenches, in a relatively strong oxidizing ambient to fill partially the trenches with silicon oxide, annealing the chip in an ambient in which any oxide growth is insignificant for a time to relieve stresses in the chip, and repeating the heating and annealing steps until the trenches are substantially filled and planarity is essentially restored to the chip.

2. The process of claim 1 in which the first filling step is done at relatively high temperature and the subsequent filling steps are done at a lower temperature.

3. The process of claim 1 in which the first filling step is done in steam at atmospheric pressure and the subsequent filling steps are done in steam at higher pressures.

4. The process of claim 1 in which the first filling layer grown is thicker than the second layer grown but each successive layer grown thereafter is thicker than the immediately preceding layer.

5. The process of claim 2 in which the first filling step is done in steam at atmospheric pressure and the subsequent filling steps are done in steam at higher pressures.

* * * * *